(12) United States Patent
Etien et al.

(10) Patent No.: US 11,777,432 B2
(45) Date of Patent: Oct. 3, 2023

(54) PROCESS FOR DISAGGREGATING CHARGES USING AN ELECTRICAL SIGNATURE

(71) Applicant: CHAUVIN ARNOUX, Asnieres-sur-Seine (FR)

(72) Inventors: Erik Etien, Asnieres-sur-Seine (FR); Laurent Rambault, Asnieres-sur-Seine (FR); Sebastien Cauet, Asnieres-sur-Seine (FR); Thierry Doget, Asnieres-sur-Seine (FR)

(73) Assignee: CHAUVIN ARNOUX, Asnieres-sur-Seine (FR)

(*) Notice: Subject to any disclaimer, the term of this patent is extended or adjusted under 35 U.S.C. 154(b) by 340 days.

(21) Appl. No.: 17/245,265

(22) Filed: Apr. 30, 2021

(65) Prior Publication Data

US 2021/0344293 A1    Nov. 4, 2021

(30) Foreign Application Priority Data

Apr. 30, 2020   (FR) ...................................... 2004307

(51) Int. Cl.
*H02P 25/02*    (2016.01)
*G05B 15/02*    (2006.01)
*G06F 17/14*    (2006.01)

(52) U.S. Cl.
CPC .............. *H02P 25/02* (2013.01); *G05B 15/02* (2013.01); *G06F 17/141* (2013.01)

(58) Field of Classification Search
CPC ....... H02P 25/02; G05B 15/02; G06F 17/141; G01H 1/00; G01H 11/06; G01R 21/133; G01R 31/343; G01R 31/34
See application file for complete search history.

(56) References Cited

U.S. PATENT DOCUMENTS

| | | | |
|---|---|---|---|
| 4,858,151 A | 8/1989 | Habara | |
| 6,289,735 B1* | 9/2001 | Dister | G01H 1/003 73/659 |
| 10,769,727 B1* | 9/2020 | Piccolo | G06Q 40/08 |
| 11,262,093 B2* | 3/2022 | Weyant | G05B 15/02 |
| 11,533,193 B2* | 12/2022 | Shyr | H04W 4/38 |

(Continued)

FOREIGN PATENT DOCUMENTS

| | | |
|---|---|---|
| EP | 3618223 A1 | 3/2020 |
| GB | 2471536 A | 1/2011 |

OTHER PUBLICATIONS

Search Report from corresponding French Application No. FR2004307, dated Jan. 13, 2021.

*Primary Examiner* — Ramesh B Patel

(74) *Attorney, Agent, or Firm* — WORKMAN NYDEGGER

(57) ABSTRACT

A process for identifying the usage of electrical equipment connected to a power supply grid has an asynchronous motor coupled to a charge including identifying the usage of the electrical equipment by using an electrical signature of this equipment. The electrical signature is determined in a previous step and consists of a limited and predetermined set of characteristic frequencies and their harmonics obtained from the only information featuring on the identification plate of the asynchronous motor, and from visual inspection of the charge and its method for coupling to the asynchronous motor.

11 Claims, 4 Drawing Sheets

(56) References Cited

U.S. PATENT DOCUMENTS

| | | | |
|---|---|---|---|
| 11,594,117 B2* | 2/2023 | Kann | G01M 3/224 |
| 11,635,080 B1* | 4/2023 | Tofte | F04D 15/0088 |
| | | | 416/63 |
| 2005/0183504 A1* | 8/2005 | Hobelsberger | G01H 1/006 |
| | | | 73/593 |
| 2011/0098867 A1* | 4/2011 | Jonsson | H01R 13/703 |
| | | | 700/295 |
| 2011/0251807 A1* | 10/2011 | Rada | G01D 4/00 |
| | | | 702/61 |
| 2012/0278272 A1* | 11/2012 | Kim | G06F 11/3006 |
| | | | 706/54 |
| 2013/0013138 A1* | 1/2013 | Lu | B60L 3/0061 |
| | | | 702/34 |
| 2013/0110621 A1* | 5/2013 | Gupta | G01D 4/004 |
| | | | 702/60 |
| 2013/0138651 A1* | 5/2013 | Lu | G06N 3/088 |
| | | | 707/E17.046 |
| 2014/0172400 A1* | 6/2014 | Majewski | F24F 1/0035 |
| | | | 702/34 |
| 2014/0207298 A1* | 7/2014 | Gupta | G05B 15/02 |
| | | | 700/291 |
| 2016/0212506 A1* | 7/2016 | Norwood | H02J 13/00017 |
| 2017/0241422 A1* | 8/2017 | Munk | F04D 29/669 |

* cited by examiner

PROCESS FOR DISAGGREGATING CHARGES USING AN ELECTRICAL SIGNATURE

TECHNICAL FIELD

The present invention relates to the field of measuring of the usage of electrical equipment in an industrial setting by disaggregation of charges, and it more particularly concerns identification of the usage of electrical equipment comprising an asynchronous motor coupled to a charge.

BACKGROUND

The technique of disaggregation of charges is known from U.S. Pat. No. 4,858,151 which discloses a process and a system based on modelling of the charge by equivalent admittance. From electrical measurements obtained for the fundamental frequency of the supply current (typically at 50 or 60 Hz), the system calculates the active and reactive powers, then deduces the equivalent admittance of the charge from these.

Yet, if it can be justified in a residential or tertiary setting, such a system which is based on a linear approximation of the charge is not faithful to reality in an industrial setting, especially in the presence of electrical equipment comprising asynchronous motors which above all are non-linear generating systems of a set of harmonics linked to the supply current as also to variations in the resistive torque of these machines due to the types of charges generated by the asynchronous motor, and to the intrinsic defects of this motor and of the charge.

Also, this analysis method reduced to the fundamental and based on calculation of admittances is limited in the case of asynchronous motors because, in the case of motors of equivalent power, the resulting admittances risk being very close.

SUMMARY

The main aim of the present invention is therefore to mitigate this drawback by proposing a process for identifying the usage of electrical equipment comprising an asynchronous motor coupled to a charge particularly adapted to an industrial setting.

This aim is achieved by a process for identifying the usage of electrical equipment connected to a power supply grid and comprising an asynchronous motor coupled to a charge, the process comprising:

obtaining at a point of electrical delivery an electrical magnitude to be measured and transforming said electrical magnitude into a useable signal, extracting, from said useable signal, a particular instant characteristic of the start-up of the electrical equipment and, from detection of the start-up, a portion of determined duration of the signal, obtaining a frequential spectrum of the portion of signal extracted, comparing the frequential spectrum obtained with each of recorded electrical signatures, recognising the relevant electrical signature and then identifying the electrical equipment as being at the origin of the recognised electrical signature, wherein the recorded electrical signature of each electrical equipment is determined with a limited and predetermined set of characteristic frequencies and their harmonics obtained from the only information featuring on the identification plate of the asynchronous motor and from visual inspection of the charge and its method for coupling to the asynchronous motor.

Therefore, by defining for each item of equipment a limited but sufficient number of characteristic frequencies, a wide spectral field can be exploited, contrary to the conventional harmonic approach which is limited to harmonic analysis around the frequency of the power grid. This process discriminates electrical charges by the frequential content of the currents by way of searching for particular frequencies obtained very simply without employing sophisticated artificial intelligence processes.

Advantageously, visual inspection of the charge consists of determining a number of blades, a number of pistons or a pulley diameter. Visual inspection of the coupling method of the charge to the asynchronous motor consists of determining a passing frequency of a belt or a meshing frequency of a reducer.

Preferably, the electrical equipment is typically one of the following: a fan, a compressor, a pump, a power generator.

The invention also relates to an identification module of the usage of electrical equipment connected to the power supply grid and comprising an asynchronous motor coupled to a charge, the identification module comprising: an acquisition module configured to obtain at a point of electrical delivery an electrical magnitude to be measured and to transform said electrical magnitude into a useable signal, an event detection module configured to extract, from said useable signal, a particular instant characteristic of the start-up of the electrical equipment, an extraction module configured to extract, from detection of the start-up, a portion of determined duration of the signal, a processing module configured to obtain a frequential spectrum of the portion of signal extracted in this way, a database configured to record a set of electrical signatures each consisting of a limited and predetermined set of characteristic frequencies and their harmonics obtained from the only information featuring on the identification plate of the asynchronous motor and from visual inspection of the charge and its method for coupling to the asynchronous motor, and a recognition and identification module for comparing the frequential spectrum obtained with each of the recorded electrical signatures, recognising the relevant electrical signature and then identifying the electrical equipment as being at the origin of the recognised electrical signature.

The acquisition module is preferably a current-measuring sensor and the processing module comprises a rapid Fourier Transform to obtain the frequential spectrum of the current from which the characteristic frequencies of the electrical equipment are extracted.

Advantageously, the characteristic frequencies are determined by an automatic search of the largest constituent in a predetermined frequency band $B=[Fmin, Fmax]$, F being the characteristic frequency.

The predetermined frequency band is preferably between 1 and 2 Hz and the portion of signal of determined duration is typically between 10 s and 1 mn.

Advantageously, the processing module is further configured to carry out pre-processing by obtaining an average over N extracted frequential spectra.

BRIEF DESCRIPTION OF THE DRAWINGS

Other characteristics and advantages of the present invention will emerge from the following description in reference to the appended drawings which illustrate an embodiment devoid of all limiting character and in which.

DESCRIPTION OF EMBODIMENTS

The present invention applies essentially to an industrial setting where charges commonly found are mostly coupled to asynchronous motors of electrical equipment such as systems for ventilation, compression, pumping, air conditioning and production of heat or cold, for example.

The invention is based on the observation made by the inventors that the electrical spectrum of a charge can also carry the mechanical characteristics of this charge, such as a particular vibration. In this way, the current is a 50 Hz sinusoidal wave modulated in frequency by the spectral constituents contained in the vibratory spectrum.

Figure 1:
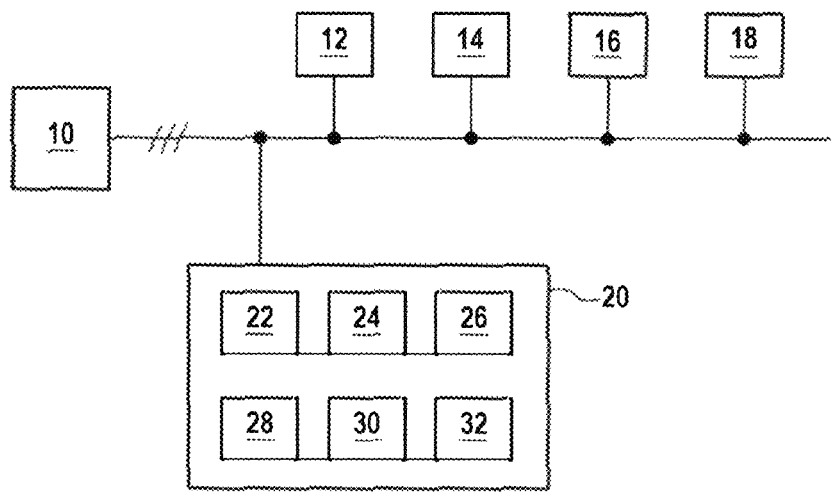
FIG. 1 illustrates an outline schematic of the disaggregation system of charges according to the invention.

FIG. 1 schematically shows an example of a triphasic power grid of an industrial site with a power transformer 10 to the terminals of which a fan 12, a compressor 14, a pump 16 and a power generator 18 are connected for example. Each of these items of electrical equipment could be coupled directly to the power grid (direct start-up or electronic start-up, then connection to the grid) or via a variator, and comprises an asynchronous motor coupled to a charge.

In the case of a motor coupled to a variator, the current on the motor side will be modulated by the harmonics required around the fundamental frequency supplied by the variator which can be variable. However, as it enters the variator the current will be modulated by the harmonics required around the fundamental frequency of the power grid (50 Hz or 60 Hz). Therefore, the type of modulation will be identical (around 50 Hz or 60 Hz), whether the motor is supplied directly by the grid or via a speed controller.

In keeping with the invention, identification of the usage of this electrical equipment is done in an identification module 20 connected to the power grid, preferably at the outlet of the power transformer 10, that is, at the point of electrical delivery of the industrial site in the region of which processing for this identification will be performed.

The identification module is configured to separate different contributions from equipment from measuring different electrical magnitudes, current or power for example, and different characteristics of these magnitudes, transitional regime, or permanent and harmonic analysis.

To achieve this, it comprises an acquisition module 22 configured to obtain the electrical magnitude to be measured and transform it into a useable signal, an event detection module 24 configured to extract, from this signal, a particular instant characteristic of the start-up (or of the stoppage for discontinuance of usage) of one or the other of the items of equipment connected to the power grid, an extraction module 26 configured to extract, from detection of this particular instant, a portion of determined duration of the signal (typically between 10 s and 1 mn) to which analysis of this signal will refer, a processing module 28 for obtaining a frequential spectrum of the portion of signal extracted in this way, a database 30 comprising all the electrical signatures of equipment connected to the power grid, and a recognition and identification module 32 for comparing the frequential spectrum obtained with each of the electrical signatures, recognising the relevant electrical signature and then identifying the equipment which is at the origin of the recognised electrical signature.

In conventional terms the acquisition module is a sensor adapted to the electrical magnitude to be measured, typically a current transformer for measuring current, and the other modules can be constituted by a single means of digital processing of computer type or microprocessor associated with appropriate software means, while the database can be constituted by a predefined zone of a memory of the microprocessor, or else form an external module of the computer.

This processing means can consist for example of a rapid Fourier Transform to obtain the frequential spectrum of the recorded signal (more elaborate techniques of zoom FFT type are seen as a way to refine the estimation) in which, according to the invention, detailed characteristic frequencies will be required earlier and forming its electrical signature. Since the preferred frequencies can be drowned out in noise, it may be necessary to carry out pre-processing by obtaining an average over N recorded spectra.

In fact, in a large number of cases, the conversion of power executed by the asynchronous electric motor coupled to the charge is done by different types of coupling (direct, belts, reducer, endless screw . . . ) which will generate vibrations in relation both to the intrinsic properties of the motor: nominal speed of rotation and of the charge, number of blades for a fan, number of pistons for a compressor for example, and also in relation to the coupling method of the motor to the charge: passing frequency of a belt, meshing frequency of a reducer for example.

These vibrations will generate oscillations of the resistive torque around its average value, then modulation of the current absorbed around the fundamental frequency of the power grid. According to the invention, locating these characteristic frequencies in the current will constitute the electrical signature accordingly for distinguishing and recognising each item of equipment.

Similarly, in practice an electric motor is never perfect in terms of construction and coupling to its charge and it will be more or less subject to defects: imbalance, eccentricity, loosening, misalignment, clearance, faulty roller bearing, damaged or worn meshing, shaft deflection. As in the previous case, these defects will generate vibrations at characteristic frequencies which will re-emerge in the frequential spectrum of the current and which could also be utilised to determine the electrical signature.

By way of example, focus will be on a three-piston compressor of 22 KW powered from a transformer HTA/BT of 400 KVA (fundamental at 50 Hz) having the following characteristics according to table 1:

TABLE 1

| Vm | Nominal motor speed | 1465 tr/mn |
|---|---|---|
| Fm | Nominal motor frequency | 24.42 Hz |
| Dm | Motor pulley diameter | 320 mm |
| Dc | Compressor pulley diameter | 440 mm |
| R | Reduction ratio | 0.727 |
| Fc | Compressor frequency | 17.76 Hz |

Figure 2:
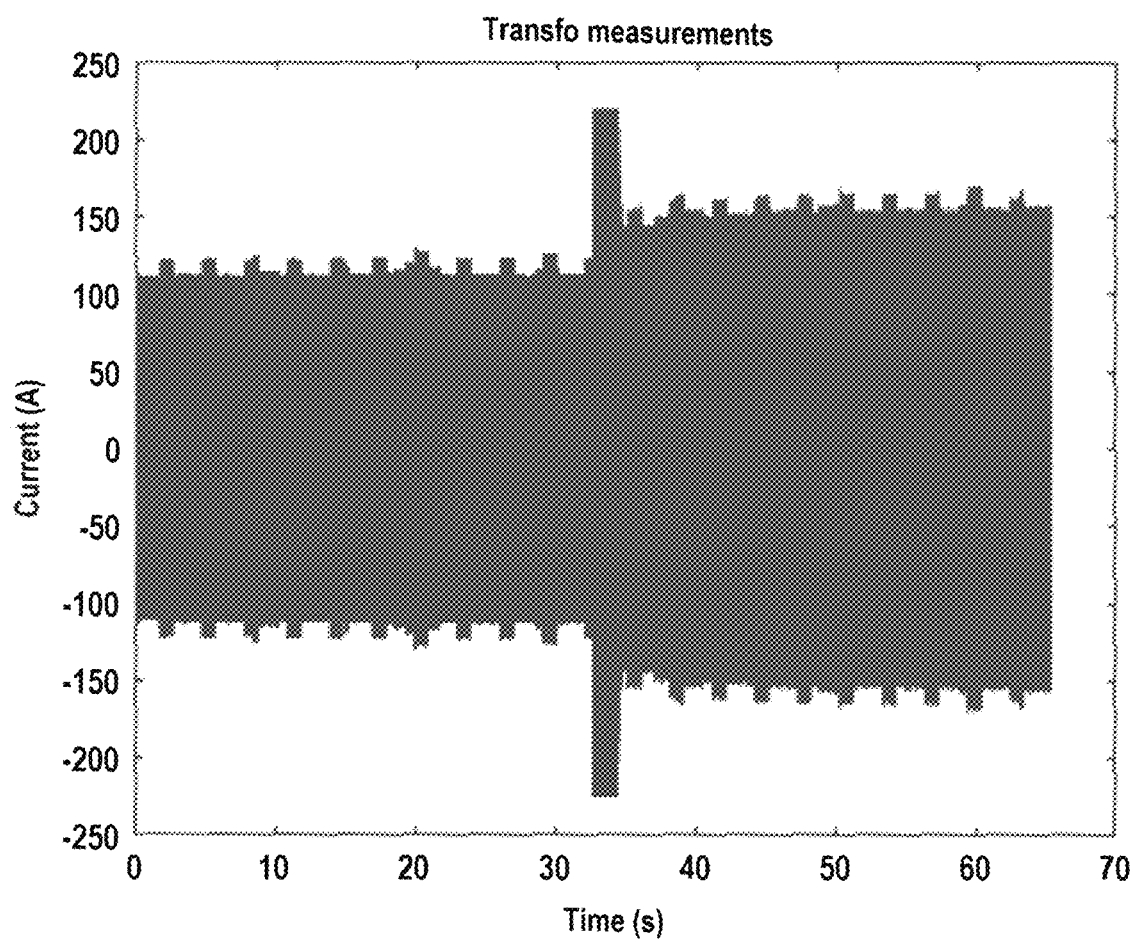
FIG. 2 shows an example of current detected on the power grid at start-up and after start-up of electrical equipment.

FIG. 2 shows the current detected by the acquisition module 22 in a phase of the transformer 10. The compressor is started up at t=32 s. Both the permanent regimes of the current are recorded in a phase between 0 and 25 s (without compressor) and between 40 s and 65 s (after start-up of the compressor). The sampling frequency of the signal is Fs=10 k Hz.

Figure 3:
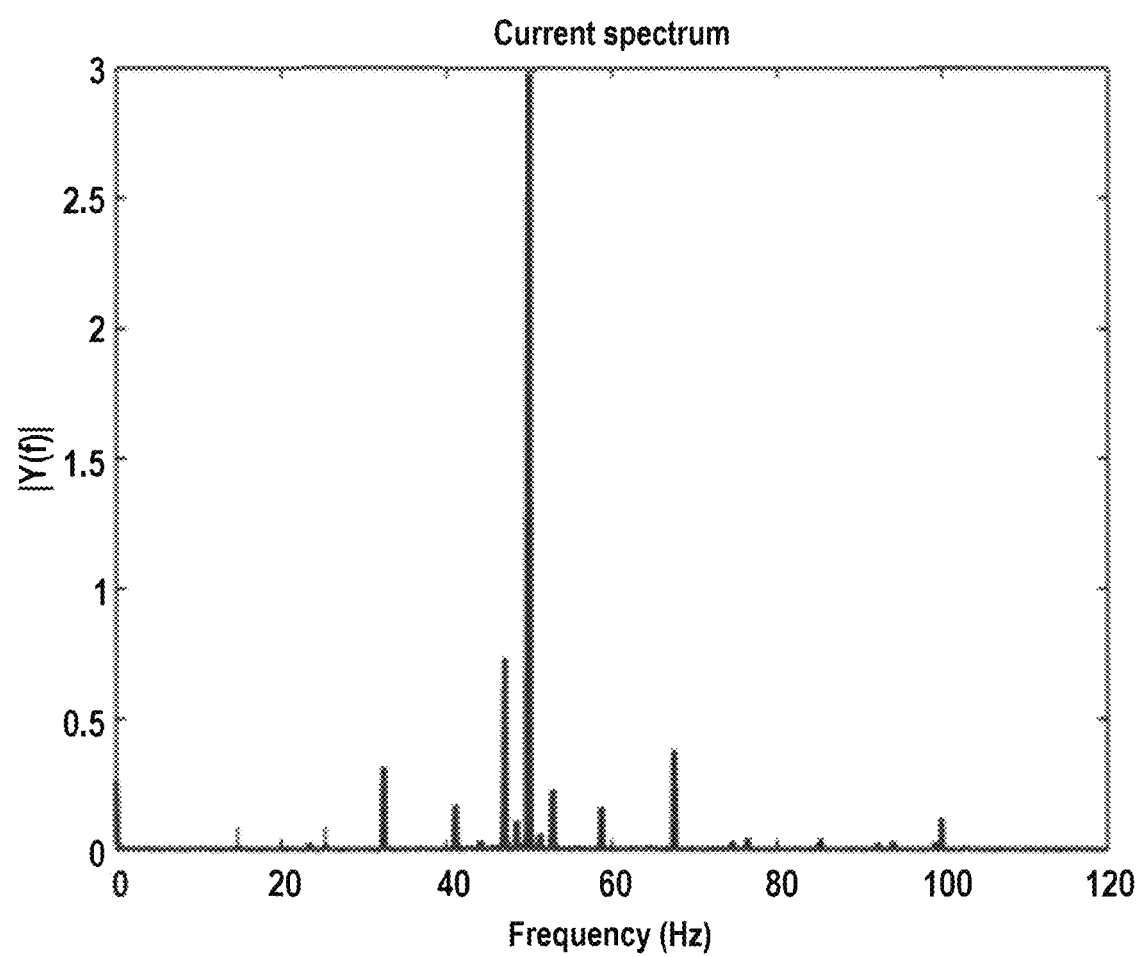
FIG. 3 shows the frequency spectrum of the current illustrated in FIG. 2.
Figure 4:
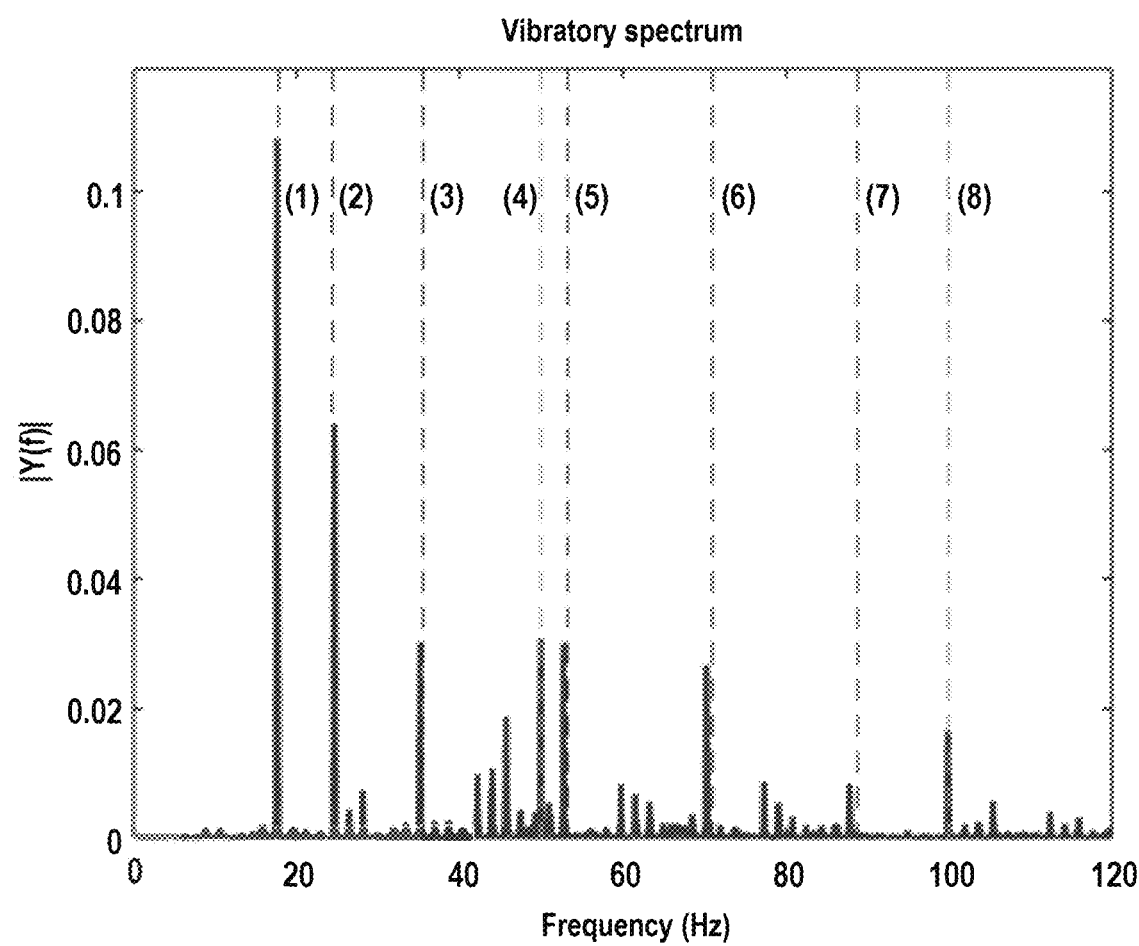
FIG. 4 illustrates the vibratory spectrum corresponding to the spectrum of the current of FIG. 3.

The spectrum of the current absorbed by the compressor and available at the output of the processing module 28 is illustrated in FIG. 3. It should be aligned with the spectrum of the vibratory signal detected in continuous operation between 50 s and 65 s (corresponding to a frequency resolution $Df=1/15=0.064$ Hz) previously by a sensor vibration such as an accelerometer and illustrated in FIG. 4 (the values 1 to 8 refer to table 2 below).

Table 2 below shows the substantial similarity of the different frequencies measured in the current spectrum relative to the theoretical values of the vibratory spectrum expected of these frequencies:

TABLE 2

|     |     | Physical magnitude | Theoretical frequency (Hz) | Measured frequency (Hz) |
| --- | --- | --- | --- | --- |
| (1) | Fc  | Compressor frequency | 17.76 | 17.58 |
| (2) | Fm  | Motor frequency | 24.42 | 24.6 |
| (3) | 2Fc | 2× Compressor frequency | 35.52 | 35.13 |
| (4) | Fe  | Mains frequency | 50 | 49.97 |
| (5) | 3Fc | 3× Compressor frequency | 53.28 | 52.71 |
| (6) | 4Fc | 4× Compressor frequency | 71 | 70.26 |
| (7) | 5Fc | 5× Compressor frequency | 88.8 | 87.85 |
| (8) | 2Fe | 2× Mains frequency | 100 | 99.9 |

A component can be noted at the nominal speed of rotation of the motor, either $Fm=24.42$ Hz, a component at the frequency of the power supply grid ($Fe=50$ Hz) and its harmonics and a component linked to the charge, or $Fc=17.76$ Hz and its harmonics. In particular, the importance of the harmonics of the frequency of the compressor could be noted.

These values are obtained advantageously and very simply from a limited amount of information featuring on the identification plate of the asynchronous motor, including the nominal speed of rotation and frequency of the power grid, and visual inspection of the charge and its method for coupling to the motor or again via an automatic search of the largest constituent in a given frequency band $B=[Fmin, Fmax]$ of low bandwidth, typically 1 to 2 Hz. For example, the motor frequency corresponding to the nominal speed of rotation of the motor is preferred in the band $B=[23$ Hz, $25$ Hz] (the motor cannot turn exactly at its nominal value) and the frequency compressor corresponding to the product of the frequency motor relative to reduction is per se preferred in the band $B=[17$ Hz, $19$ Hz] (the motor frequency is not exactly the nominal frequency).

Components which do not appear on the vibratory spectrum are also noted on the current spectrum, since they did not originate from variations in resistive torque, their origin (slot harmonics, windings, etc. . . . ) rather being magnetic, but which could be exploited to enrich the electrical signature of the equipment.

Figure 5:
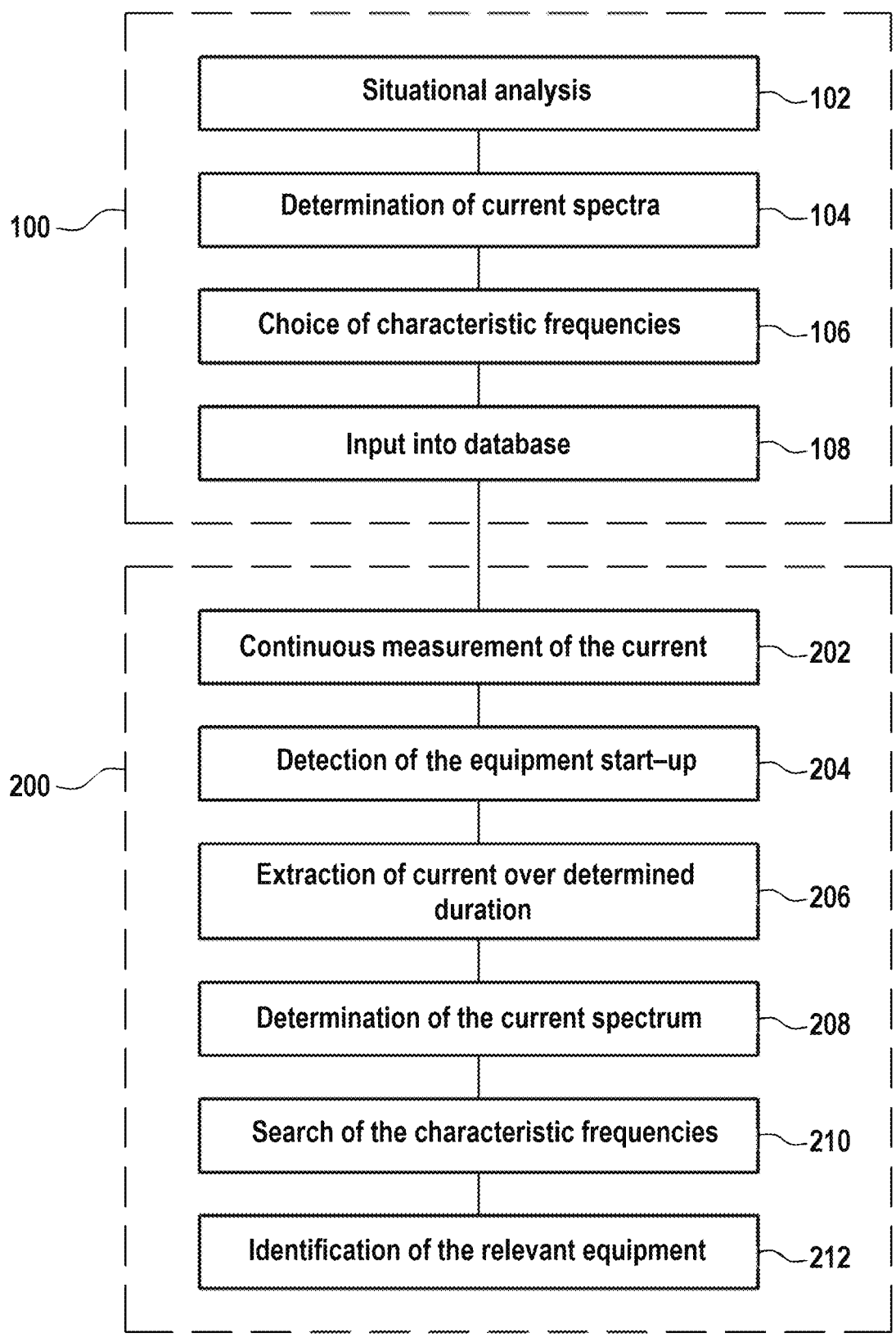
FIG. 5 shows the different steps of the process of the invention as executed in the system of FIG. 1.

The different steps of the process executed in the invention are now illustrated with respect to FIG. 5 and are made up of a learning phase 100 and an operational phase 200.

The learning phase 100 comprises four successive steps consisting of a first step 102 of situational analysis of electricity consumption, in a second step 104 consisting of determining the current spectra of each item of equipment monitored, in a third step 106 a choice in these current spectra of characteristic frequencies and in a fourth step 108 for each item of equipment monitored consisting of inputting of the characteristic frequencies selected into the database of the recognition and identification module.

The situational analysis consists of listing the electrical equipment which must be monitored by the system and the usages of which are to be known. Determining the spectra of the current is preferably carried out by measuring the current at the base of the equipment, followed by FFT processing, but theoretical analysis of the physical process by means of its identification plate and the type of charge generated is all also possible and very simple to perform. The choice of characteristic frequencies which will be entered in the database is made as explained previously and is based on the variations in resistive torque linked to the speed of rotation of the asynchronous motor and to the intrinsic properties and coupling of the charge, such as the number of blades for a fan, the number of pistons for a compressor, the passing frequency of a belt or again the meshing frequency of a reducer.

The operational phase 200 per se comprises six consecutive steps consisting of a continuous measurement (step 202) of the current detected on the power grid made by the acquisition module 22, a detection (step 204) of the equipment start-up on this grid by the event detection module 24, registration (step 206) of the current over a determined duration by the extraction module 26, determination (step 208) of the current spectrum by calculation FFT in the region of the processing module 28, search (step 210) of the characteristic frequencies in the database 30, and identification (step 212) of the relevant equipment by the recognition and identification module 32.

It will be clear that if the abovementioned analysis were performed on the measuring of a single current, it is evident to the skilled person that it could be extended to three currents to obtain a vectoral representation of the current and in this case facilitate use of the AM/FM demodulation technique for example. Similarly, it could also be extended to currents and voltages to obtain a power spectrum.

The invention claimed is:

1. A process for identifying the usage of electrical equipment connected to a power supply grid and comprising an asynchronous motor coupled to a charge, the process comprising:
    obtaining at a point of electrical delivery an electrical magnitude to be measured and transforming said electrical magnitude into a useable signal;
    extracting, from said useable signal, a particular instant characteristic of the start-up of the electrical equipment and, from detection of the start-up, a portion of determined duration of the signal;
    obtaining a frequential spectrum of the portion of signal extracted;
    comparing the frequential spectrum obtained with each of recorded electrical signatures;
    recognising the relevant electrical signature and then identifying the electrical equipment as being at the origin of the recognised electrical signature;
    wherein the recorded electrical signature of each electrical equipment is determined with a limited and predetermined set of characteristic frequencies and their harmonics obtained from the only information featuring on the identification plate of the asynchronous motor and from visual inspection of the charge and its method for coupling to the asynchronous motor.

2. The process according to claim 1, wherein visual inspection of the charge consists of determining a number of blades, a number of pistons or a pulley diameter.

3. The process according to claim 2, wherein visual inspection of the coupling method of the charge to the asynchronous motor consists of determining a passing frequency of a belt or a meshing frequency of a reducer.

4. The process according to claim 1, wherein the information featuring on the identification plate of the asynchronous motor includes the nominal speed of rotation of the motor and the frequency of the power supply grid.

5. The process according to claim 1, wherein the electrical equipment is typically one of the following: a fan, a compressor, a pump, a power generator.

6. An identification module of the usage of electrical equipment connected to the power supply grid and comprising an asynchronous motor coupled to a charge, the identification module comprising:
    an acquisition module configured to obtain at a point of electrical delivery an electrical magnitude to be measured and transform said electrical magnitude into a useable signal;
    an event detection module configured to extract, from said useable signal, a particular instant characteristic of the start-up of the electrical equipment;
    an extraction module configured to extract, from detection of the start-up, a portion of determined duration of the signal;
    a processing module configured to obtain a frequential spectrum of the portion of signal extracted in this way;
    a database configured to record a set of electrical signatures each consisting of a limited and predetermined set of characteristic frequencies and their harmonics obtained from the only information featuring on the identification plate of the asynchronous motor and from visual inspection of the charge and its method for coupling to the asynchronous motor; and
    a recognition and identification module for comparing the frequential spectrum obtained with each of the recorded electrical signatures, recognising the relevant electrical signature and then identifying the electrical equipment as being at the origin of the recognised electrical signature.

7. The module according to claim 6, wherein the acquisition module is a current-measuring sensor and the processing module comprises a rapid Fourier Transform to obtain the frequential spectrum of the current from which the characteristic frequencies of the electrical equipment are extracted.

8. The module according to claim 7, wherein the characteristic frequencies are determined by an automatic search of the largest constituent in a predetermined frequency band B=[Fmin, Fmax], F being the characteristic frequency.

9. The module according to claim 8, wherein the predetermined frequency band is typically between 1 and 2 Hz.

10. The module according to claim 6, wherein the portion of signal of determined duration is typically between 10 s and 1 mn.

11. The module according to claim 6, wherein the processing module is further configured to carry out pre-processing by obtaining an average over N extracted frequential spectra.

* * * * *